United States Patent [19]
Vitunic et al.

[11] Patent Number: 5,714,897
[45] Date of Patent: Feb. 3, 1998

[54] PHASE-SHIFTED TRIANGLE WAVE GENERATOR

[75] Inventors: Mark R. Vitunic; Daniel D. Culmer, both of San Jose, Calif.

[73] Assignee: Micro Linear Corporation, San Jose, Calif.

[21] Appl. No.: 666,746

[22] Filed: Jun. 19, 1996

[51] Int. Cl.$^6$ .............................. H03K 4/90; H03K 4/06; H03K 5/153

[52] U.S. Cl. .................. 327/136; 327/131; 327/231; 327/237

[58] Field of Search ................... 327/231, 234, 327/235, 236, 237, 90, 91, 94, 96, 246, 131, 164, 291, 132, 134, 238, 254, 255, 276, 277, 278, 152, 153, 161, 261, 263, 172, 173, 174, 136, 137

[56] References Cited

U.S. PATENT DOCUMENTS

| | | | |
|---|---|---|---|
| 3,649,845 | 3/1972 | Foch | 327/131 |
| 4,008,421 | 2/1977 | Bird | 318/171 |
| 4,101,821 | 7/1978 | Kirby | 327/246 |
| 4,223,261 | 9/1980 | White | 318/721 |
| 4,482,961 | 11/1984 | Kilner et al. | 364/428 |
| 4,618,787 | 10/1986 | Jacksier et al. | 327/276 |
| 4,680,526 | 7/1987 | Okuyama et al. | 318/802 |
| 4,806,880 | 2/1989 | Laws | 331/8 |
| 4,825,132 | 4/1989 | Gritter | 318/811 |
| 4,841,251 | 6/1989 | Hartmann et al. | 327/131 |
| 4,866,397 | 9/1989 | Kimyacioglu | 327/237 |
| 4,928,043 | 5/1990 | Plunkett | 318/254 |
| 4,949,364 | 8/1990 | Yukawa | 327/238 |
| 4,962,339 | 10/1990 | Schauder | 318/798 |
| 4,962,344 | 10/1990 | Bohrer . | |
| 5,032,771 | 7/1991 | Kerkman et al. | 318/52 |
| 5,066,899 | 11/1991 | Nashiki | 318/807 |
| 5,111,085 | 5/1992 | Stewart | 327/278 |
| 5,111,150 | 5/1992 | Casey | 327/237 |
| 5,132,599 | 7/1992 | Kono et al. | 318/618 |
| 5,172,036 | 12/1992 | Cameron | 318/138 |
| 5,206,543 | 4/1993 | Takita et al. | 327/91 |
| 5,218,283 | 6/1993 | Wills et al. | 318/748 |
| 5,231,339 | 7/1993 | Kishimoto et al. | 318/807 |
| 5,247,237 | 9/1993 | Koyama et al. | 318/808 |
| 5,252,905 | 10/1993 | Wills et al. | 318/807 |

(List continued on next page.)

OTHER PUBLICATIONS

Gottlieb, I. M., *Electric Motors & Control Techniques*, 2nd Ed., pp. 147–149, 235–247, TAB Books, 1994.

"ML4421—Variable Speed AC Induction Motor Controller", Micro Linear Corporation, Oct. 1995.

Primary Examiner—Timothy P. Callahan
Assistant Examiner—Terry L. Englund
Attorney, Agent, or Firm—Haverstock & Associates

[57] ABSTRACT

A signal generator generates a reference signal, centered about a reference voltage and having a predetermined period. The signal generator also generates output signals P and Z. The output signal P is a squarewave which changes levels at the peaks of the reference signal. The output signal Z is a squarewave which changes levels at the reference voltage crossings of the reference signal. A phase-shifted signal generator generates a phase-shifted signal using the output signals P and Z by switching in appropriate signal levels from the signal generator. The output signals P and Z are input to a switch control circuit which controls a network of switches, depending on a current region of the reference signal, to couple appropriate signals to an amplifier circuit. The switch control circuit determines the current region based on the state of the output signals P and Z. The amplifier circuit provides the phase-shifted signal in response to the signals coupled to it by the network of switches. In an alternate embodiment, the output signal Z is generated by a hysteretic comparator and changes levels at positive and negative threshold levels above and below the reference voltage. The values of the positive and negative threshold values are variable and determine the degree of phase shift between the phase-shifted signal and the reference signal.

42 Claims, 9 Drawing Sheets

U.S. PATENT DOCUMENTS

| | | | |
|---|---|---|---|
| 5,278,486 | 1/1994 | Kim | 318/811 |
| 5,304,911 | 4/1994 | Anderson | 318/729 |
| 5,334,923 | 8/1994 | Lorenz et al. | 318/805 |
| 5,345,160 | 9/1994 | Corniere | 318/811 |
| 5,376,866 | 12/1994 | Erdman | 318/254 |
| 5,410,188 | 4/1995 | Segaram | 327/237 |
| 5,428,285 | 6/1995 | Koyama et al. | 318/799 |
| 5,451,832 | 9/1995 | Cameron et al. | 318/375 |

TRI0

TRI90

P

Z

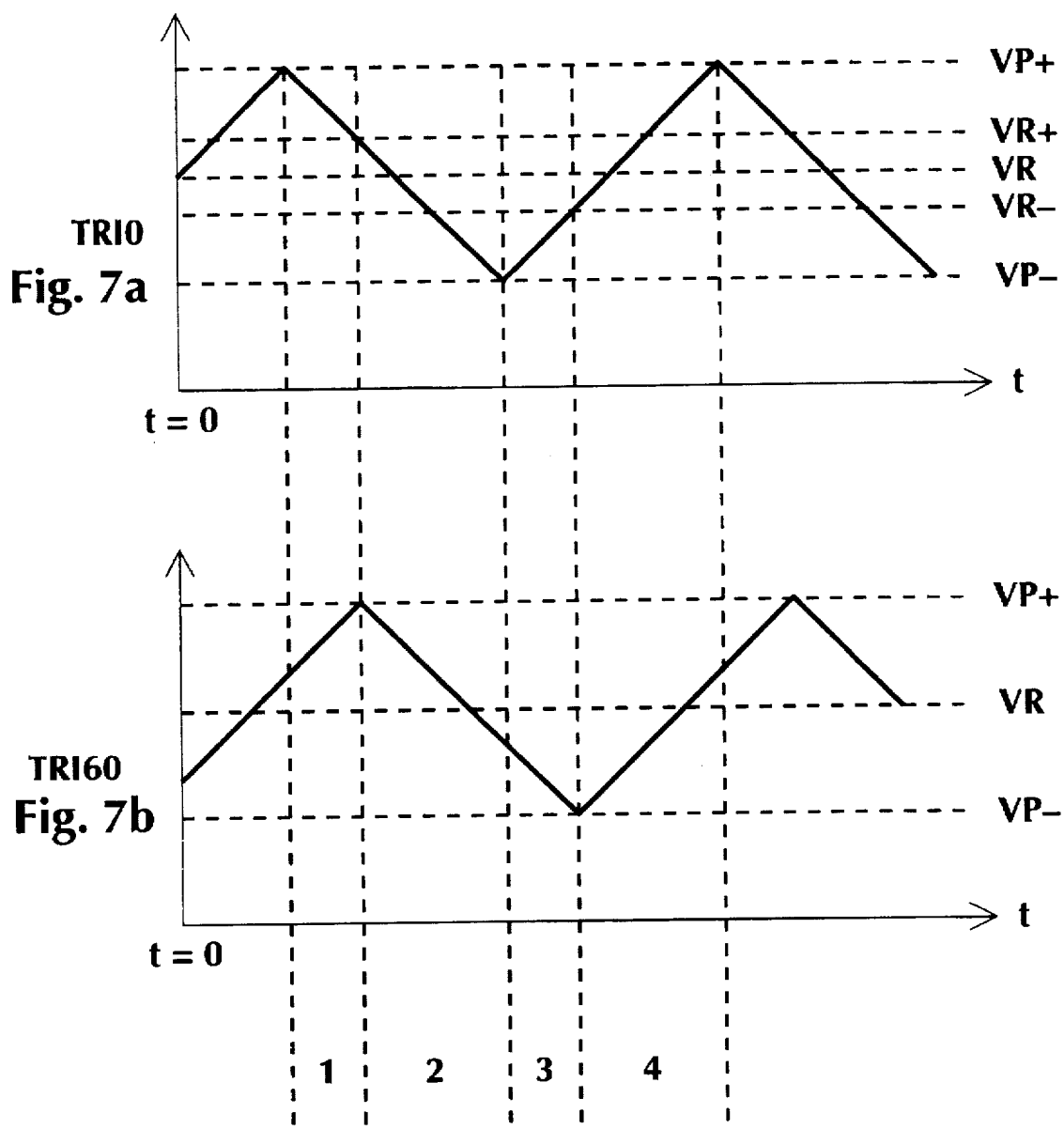
Fig. 7a TRI0
Fig. 7b TRI60
Fig. 7c PA
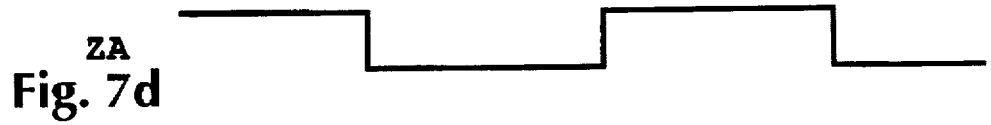
Fig. 7d ZA

PHASE-SHIFTED TRIANGLE WAVE GENERATOR

FIELD OF THE INVENTION

The present invention relates to the field of waveform generator circuits. More particularly, the present invention relates to the field of circuits for generating phase-shifted waveforms.

BACKGROUND OF THE INVENTION

A triangle wave signal generator circuit is illustrated in FIG. 1. A reference voltage VR is coupled to a first terminal of a resistor R1 and to a negative input of a comparator 12. A first terminal of a current source I1 is coupled to a supply voltage VCC. A second terminal of the current source I1 is coupled to a second terminal of the resistor R1, to a first terminal of a switch SW1 and to a positive input of a comparator 10. A second terminal of the switch SW1 is coupled to a first terminal of a current source I2. A second terminal of the current source I2 is coupled to ground. The current source I2 sources twice as much current as the current source I1.

A first terminal of a current source I3 is coupled to the supply voltage VCC. A second terminal of the current source I3 is coupled to a first terminal of a switch SW2, to a first terminal of a capacitor C0, to a negative input of the comparator 10 and to a positive input of the comparator 12, thereby forming a node, from which the triangle wave signal TRI0 is provided. A second terminal of the switch SW2 is coupled to a first terminal of a current source I4. A second terminal of the current source I4 is coupled to ground. The current source I4 sources twice as much current as the current source I3. A second terminal of the capacitor C0 is coupled to ground. An output signal P is provided from the output of the comparator 10 and is coupled to control the switches SW1 and SW2. An output signal Z is provided from the output of the comparator 12.

The triangle wave signal TRI0, generated by the triangle wave generator of FIG. 1, is illustrated in FIG. 3A. The output signal P, provided from the output of the comparator 10, is illustrated in FIG. 3C. The output signal P is a squarewave, having a period equal to the period of the triangle wave signal TRI0, which changes levels at the high and low peaks of the triangle wave signal TRI0. The output signal P is at a low value when the triangle wave signal TRI0 is declining and at a high value when the triangle wave signal TRI0 is increasing. The output signal Z, provided from the output of the comparator 12, is illustrated in FIG. 3D. The output signal Z is a squarewave, also having a period equal to the period of the triangle wave signal TRI0, which changes levels at the zero or reference crossings of the triangle wave signal TRI0. The output signal Z is at a high value when the triangle wave signal TRI0 is above the level of the reference voltage signal VR and at a low value when the triangle wave signal TRI0 is below the level of the reference voltage signal VR.

The triangle wave signal TRI0 is centered around the reference voltage signal VR. The positive peak level VP+ and the negative peak level VP− of the triangle wave signal are determined by the value of the current flowing from the current source I1 and the resistance value of the resistor R1 according to the following equations:

$$VP+ = VR + I1 R1 \quad (1)$$

$$VP- = VR - I1 R1 \quad (2)$$

The positive peak voltage level VP+ is equal to the reference voltage level VR plus a voltage level dropped across the resistor R1 when the switch SW1 is open and the current from the current source I1 is flowing through the resistor R1. The negative peak voltage level VP− is equal to the reference voltage VR minus a voltage level dropped across the resistor R1 when the switch SW1 is closed and a level of current equal to the difference between the level of current drawn by the current source I2 and the level of current supplied by the current source I1. Because the current source I2 draws twice as much current as the current source I1 supplies, this level of current is equal to the level of current supplied by the current source I1. Accordingly, the peak values of the triangle wave signal TRI0 can be adjusted by selectively changing the values of the current provided from the current source I1 drawn by the current source I2 and/or the resistance value of the resistor R1.

The reference voltage VR is maintained at a constant level and provides the midpoint of the triangle wave signal. Using the reference voltage VR, the triangle wave generator of FIG. 1, generates the triangle wave signal TRI0 by appropriately charging and discharging the capacitor C0. The level of the triangle wave signal TRI0 at a particular point in time is equal to the instantaneous voltage level across the capacitor C0 at that point in time. The switches SW1 and SW2 are controlled by the output signal P to simultaneously open and close. The switches SW1 and SW2 are both open when the output signal P provided from the comparator 10 is at a high voltage level. The switches SW1 and SW2 are both closed when the output signal P provided from the comparator 10 is at a low voltage level.

When the switches SW1 and SW2 are open, the current from the current source I3 is used to store charge across the capacitor C0 and thereby increase the voltage level across the capacitor C0. Accordingly, when the switches SW1 and SW2 are open, the value of the triangle wave signal increases linearly. The voltage level across the capacitor C0 is represented at the negative input of the comparator 10. When the switch SW1 is open, the voltage level at the positive input of the comparator 10 is raised to the positive peak voltage level VP+ because the current from the current source I1 is flowing through the resistor R1 towards the source of the reference voltage VR, thereby increasing the voltage level at the positive input of the comparator 10 to a level equal to the reference voltage VR plus the voltage level dropped across the resistor R1. The output signal P provided from the comparator 10 remains at a high level and the switches SW1 and SW2 remain open until the voltage level across the capacitor C0 and at the negative input of the comparator 10 rises to a level above the positive peak voltage level VP+ at the positive input of the comparator 10. As soon as the voltage level across the capacitor C0 rises to a level above the positive peak voltage level VP+, the output signal P provided from the comparator 10 falls to a logical low voltage level and causes the switches SW1 and SW2 to close.

When the switches SW1 and SW2 are closed, the voltage level across the capacitor C0 is discharged by the current source I4, thereby linearly decreasing the value of the triangle wave signal TRI0. Because the current drawn by the current source I4 is twice the amount of the current supplied by the current source I3, the current drawn from the capacitor C0 is equal to the current supplied by the current source I3 and the capacitor C0 is discharged at a rate equal to the rate at which it was charged. When the switch SW1 is closed, an amount of current equal to the current from the current source I1 flows through the resistor R1, thereby lowering the voltage level at the positive input of the comparator 10 to a level equal to the negative peak voltage level VP–. The output signal P remains at a low voltage level and the switches SW1 and SW2 remain closed until the voltage level across the capacitor C0 and at the negative input of the comparator 10 falls to a level below the negative peak voltage level VP– at the positive input of the comparator 10. As soon as the voltage level across the capacitor C0 falls to a level below the negative peak voltage level VP–, the output signal P provided from the comparator 10 rises to a high voltage level and causes the switches SW1 and SW2 to open. The capacitor C0 will then begin to charge again and linearly increase the level of the triangle wave signal TRI0.

Phase-shifted sinusoidal signals are used to power two and three phase AC induction motors. U.S. patent application Ser. No. 08/547,592, filed on Oct. 24, 1995 and entitled TWO-PHASE ELECTRONIC CONTROL OF A THREE-PHASE INDUCTION MOTOR, which is hereby incorporated by reference, teaches an electronic control for induction motors using phase-shifted sinusoidal signals. The phase-shifted sinusoidal signals are generated from phase-shifted triangle wave signals. A triangle wave signal generator, as illustrated in FIG. 1, and a phase-shifted triangle wave signal generator, as illustrated in FIG. 2, are used to generate a triangle wave signal TRI0 and a ninety degree phase-shifted triangle wave signal TRI90, illustrated in FIG. 3B, respectively. The triangle wave signal TRI90 is ninety degrees out of phase from the triangle wave signal TRI0. The triangle wave signal TRI0 is used as a reference and the output signals P and Z are used by the phase-shifted triangle wave signal generator to generate the triangle wave signal TRI90.

Within the phase-shifted triangle wave signal generator illustrated in FIG. 2, the output signal P is coupled to a first terminal of a restore resistor ROS and to a negative input of a comparator 14. A second terminal of the resistor ROS is coupled to a positive input of the comparator 14 and to a first terminal of a capacitor COS. A second terminal of the capacitor COS is coupled to ground. The reference voltage VR is coupled to a positive input of an op-amp 16. A negative input of the op-amp 16 is coupled to a first terminal of a switch SW3 and to a first terminal of a switch SW4. A second terminal of the switch SW4 is coupled to a first terminal of a switch SW5. A second terminal of the switch SW3 is coupled to a second terminal of the switch SW5 and to the output of the op-amp 16. The output of the comparator 14 is coupled to control the switches SW3, SW4 and SW5.

A first terminal of a current source I5 is coupled to the supply voltage VCC. A second terminal of the current source I5 is coupled to the second terminal of the switch SW4, to the first terminal of the switch SW5, to a first terminal of a switch SW6 and to a first terminal of a capacitor C90, thereby forming a node, from which the phase-shifted triangle wave signal TRI90 of the phase-shifted triangle wave generator is provided. A second terminal of the capacitor C90 is coupled to ground. The value of the capacitor C90 is matched to the value of the capacitor C0. A second terminal of the switch SW6 is coupled to a first terminal of a current source I6. A second terminal of the current source I6 is coupled to ground. The current source I6 sources twice as much current as the current source I5. The output signal Z from the comparator 12 is coupled to control the operation of the switch SW6.

The level of the phase-shifted triangle wave signal TRI90 at a point in time is equal to the instantaneous level of the voltage stored across the capacitor C90. The capacitor C90 is charged by the current source I5 when the switch SW6 is open and the capacitor C90 is discharged by current drain by the current source I6 when the switch SW6 is closed. The switch SW6 is open when the output signal Z is at a high voltage level. The switch SW6 is closed when the output signal Z is at a low voltage level. Therefore, when the triangle wave signal TRI0 is at a level equal to the reference voltage VR, the triangle wave signal TRI90 will be at a level equal to either the positive peak voltage VP+ or the negative peak voltage VP–. This provides a ninety degree phase shift in the two waveforms.

The op-amp 16 and the switches SW3–SW5 form a DC level restore circuit and reset the phase-shifted triangle wave signal TRI90 to a level equal to the reference voltage VR when the triangle wave signal TRI0 switches from increasing to decreasing or from decreasing to increasing (i.e., when the level of the output signal P changes). The switch SW3 is normally closed, keeping the op-amp 16 in a balanced ready state with its output and the negative input both equal to the reference voltage VR. When the level of the output signal P changes from a logical high voltage level to a logical low voltage level, a pulse is output from the comparator 14 of a duration controlled by the value of the resistor ROS and the capacitor COS. When the pulse from the comparator 14 occurs, the switches SW4 and SW5 will close and the switch SW3 will open. If the voltage across the capacitor C90 is not at a level equal to the reference voltage VR, the voltage level across the capacitor C90 will be forced to a level equal to the reference voltage VR. The resistor ROS and the capacitor COS cause the output of the comparator 14 to remain high for a period of time sufficient for the phase-shifted triangle wave signal TRI90 to reset to the reference voltage level VR. This re-centers the phase-shifted triangle wave signal TRI90 about the reference voltage VR.

As illustrated in FIG. 2, this phase-shifted triangle wave signal generator requires two external capacitors COS and C90 in addition to the external capacitor C0. Furthermore, the external capacitor C90 must be matched to the external capacitor C0. This phase-shifted triangle wave signal generator also requires the DC level restore circuit to restore the level of the phase-shifted triangle wave signal TRI90 to a level equal to the reference voltage VR when the output signal P changes states from a logical high voltage level to a logical low voltage level.

What is needed is a phase-shifted triangle wave signal generator which does not require two additional external capacitors in order to form a phase-shifted triangle wave signal. What is further needed is a phase-shifted triangle wave signal generator which does not require a DC level restore circuit.

SUMMARY OF THE INVENTION

A signal generator generates a reference signal, centered about a reference voltage and having a predetermined period. The signal generator also generates output signals P and Z. The output signal P is a squarewave which changes levels at the peaks of the reference signal. The output signal Z is a squarewave which changes levels at the reference voltage crossings of the reference signal.

A phase-shifted signal generator generates a phase-shifted signal using the output signals P and Z by switching in appropriate signal levels from the signal generator. The output signals P and Z are input to a switch control circuit which controls a network of switches, depending on a current region of the reference signal, to couple appropriate signals to an amplifier circuit. The switch control circuit determines the current region based on the state of the output signals P and Z. The amplifier circuit provides the phase-shifted signal in response to the signals coupled to it by the network of switches.

In an alternate embodiment, the output signal Z is generated by a hysteretic comparator and changes levels at positive and negative threshold levels above and below the reference voltage. The values of the positive and negative threshold values are variable and determine the degree of phase shift between the phase-shifted signal and the reference signal.

BRIEF DESCRIPTION OF THE DRAWINGS

FIG. 7A illustrates a waveform of a triangle wave signal TRI0, generated by the triangle wave signal generator of FIG. 6.

FIG. 7B illustrates a waveform of a phase-shifted triangle wave signal TRI60.

FIG. 7C illustrates a waveform of an output signal PA.

FIG. 7D illustrates a waveform of an output signal ZA.

DETAILED DESCRIPTION OF THE PREFERRED EMBODIMENT

Figure 1:
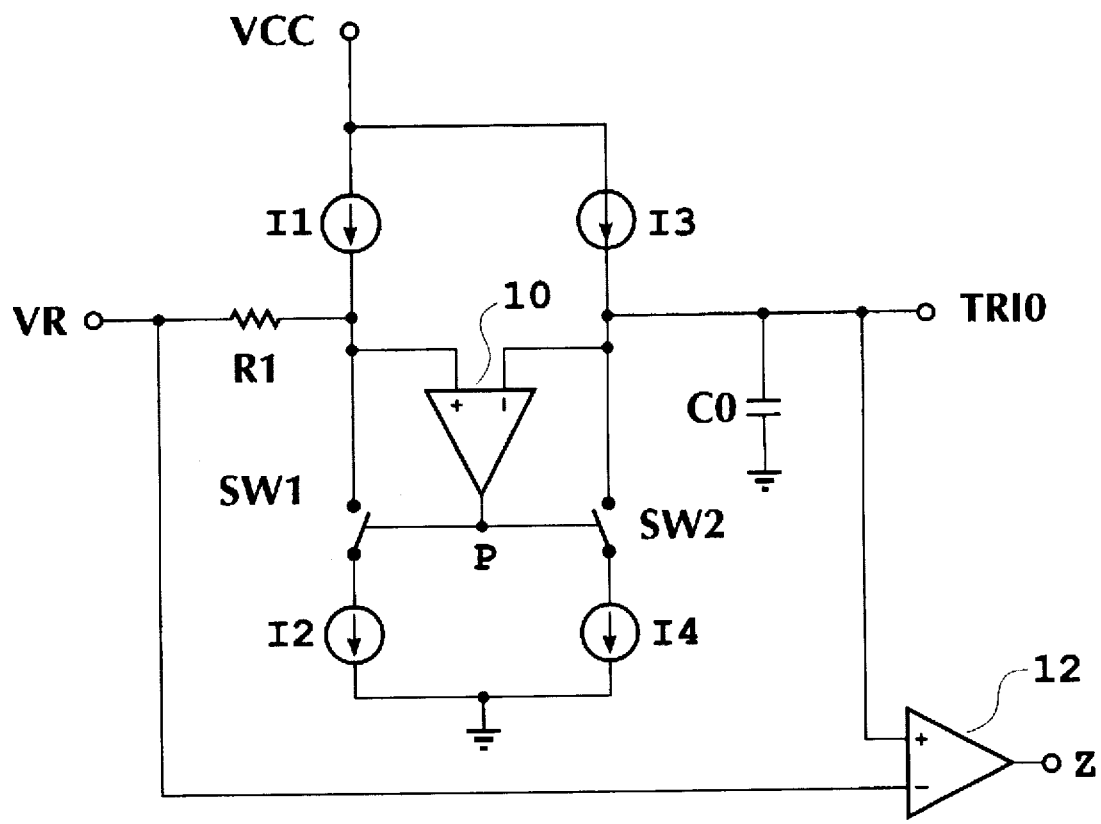
FIG. 1 illustrates a schematic diagram of a triangle wave signal generator.
Figure 2:
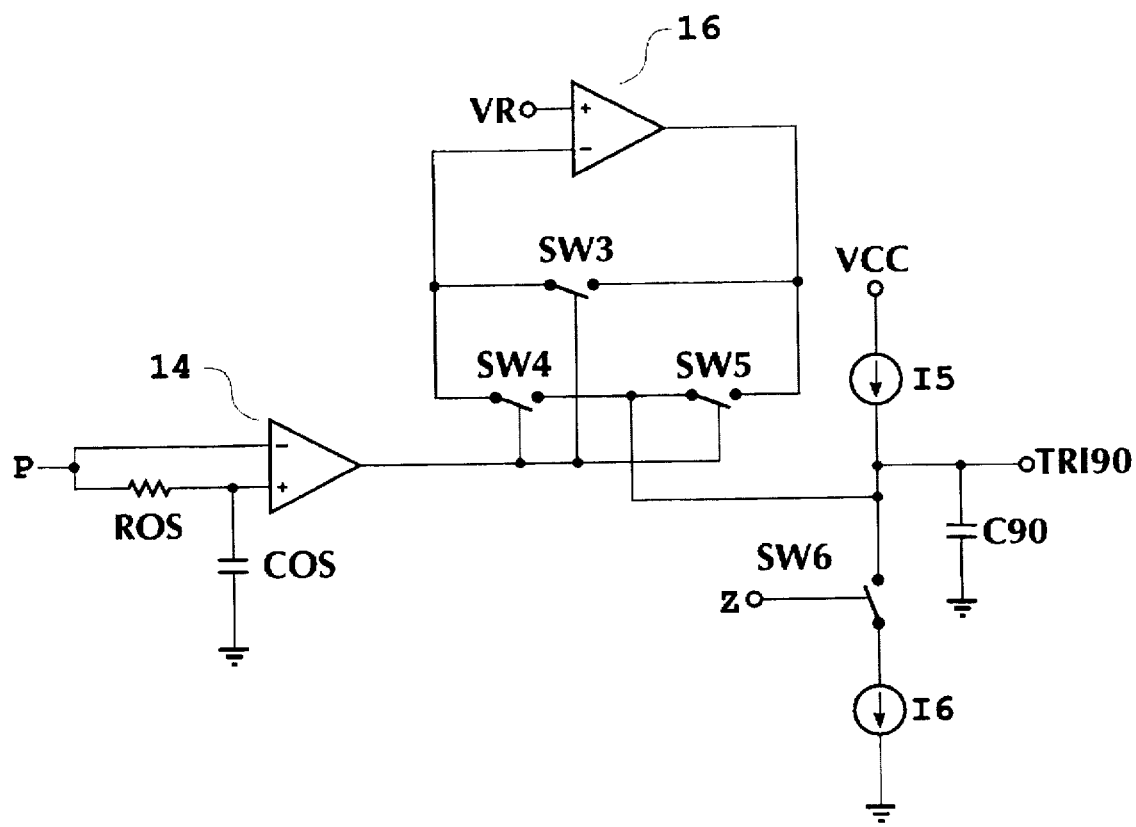
FIG. 2 illustrates a schematic diagram of a phase-shifted triangle wave signal generator.
Figure 3A:
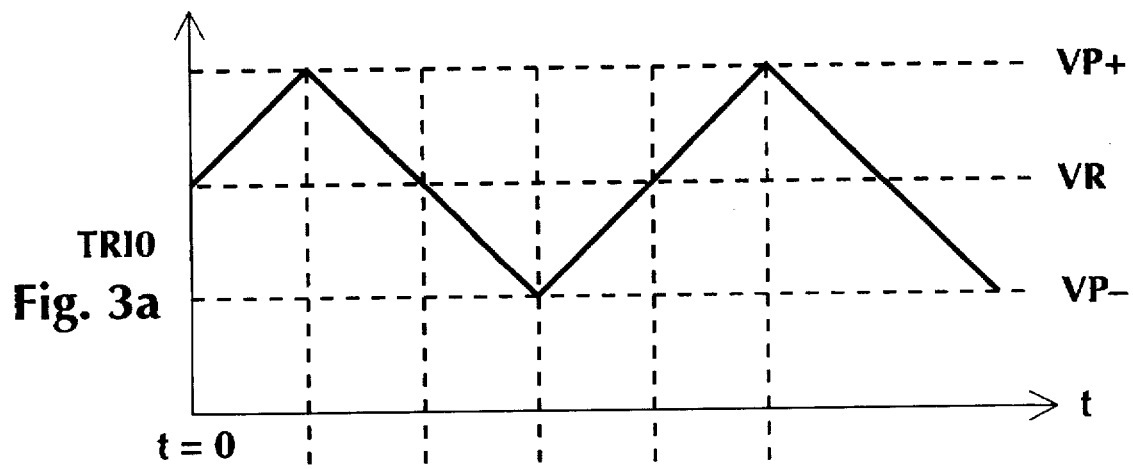
FIG. 3A illustrates a waveform of a triangle wave signal TRI0.
Figure 3B:
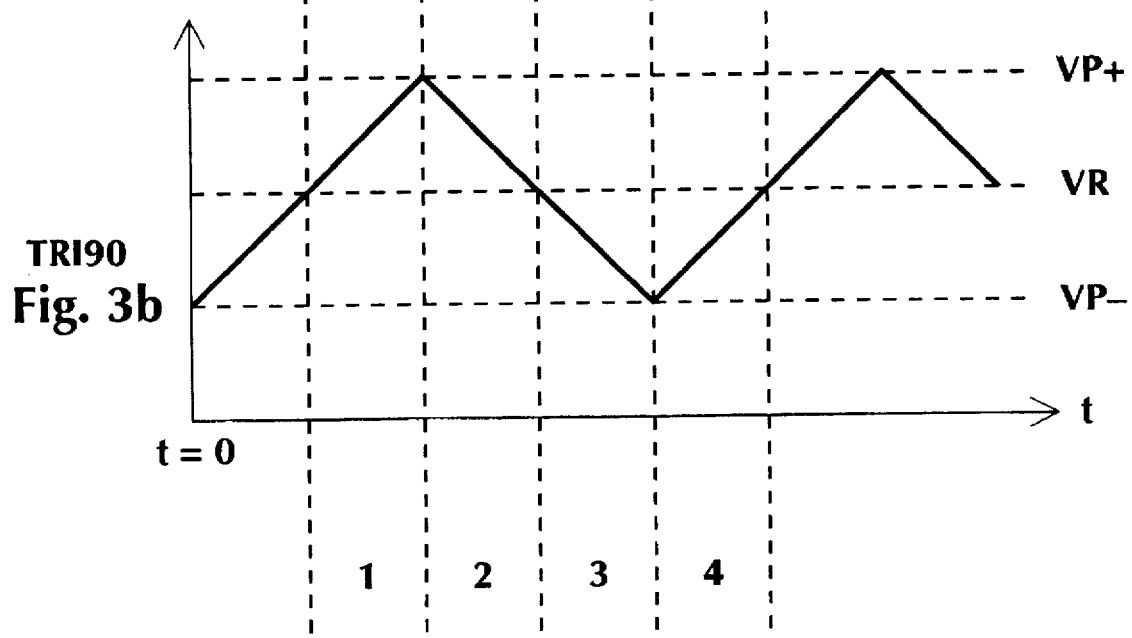
FIG. 3B illustrates a waveform of a phase-shifted triangle wave signal TRI90.
Figure 3C:
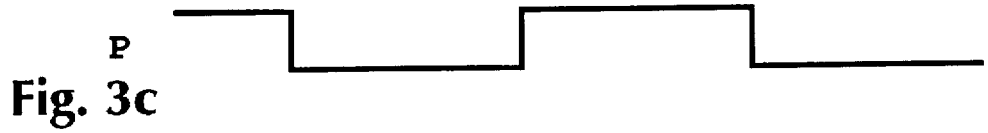
FIG. 3C illustrates a waveform of an output signal P.
Figure 3D:
FIG. 3D illustrates a waveform of an output signal Z.
Figure 4:
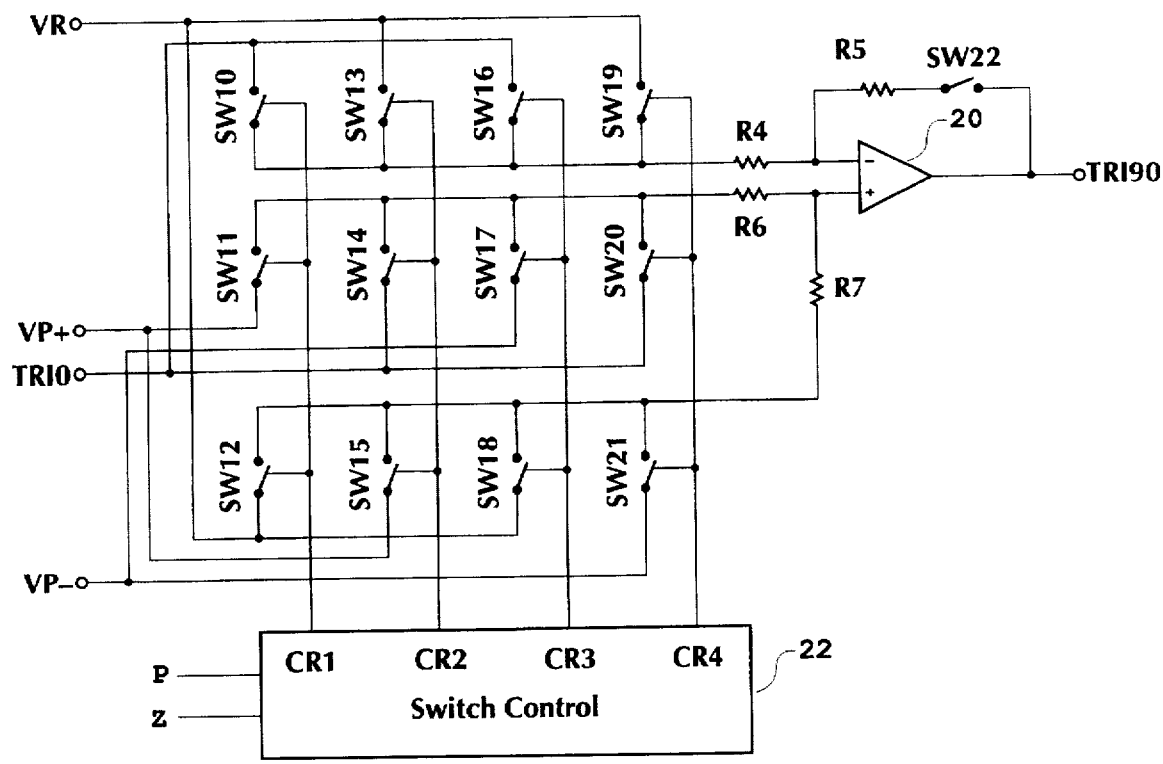
FIG. 4 illustrates a schematic diagram of a phase-shifted triangle wave signal generator according to the present invention.

A schematic diagram of a phase-shifted triangle wave generator according to the present invention is illustrated in FIG. 4. The phase-shifted triangle wave generator uses the triangle wave signal TRI0 and other signals generated by the triangle wave generator of FIG. 1 to generate the phase-shifted triangle wave signal TRI90, as illustrated in FIG. 3B.

An inverting input of an amplifier 20 is coupled to a first terminal of a resistor R4 and to a first terminal of a resistor R5. A second terminal of the resistor R5 is coupled to a first terminal of a switch SW22. A second terminal of the switch SW22 is coupled to an output of the amplifier 20, thereby forming a node from which the phase-shifted triangle wave signal TRI90 is provided. A second terminal of the resistor R4 is coupled to a first terminal of switches SW10, SW13, SW16 and SW19. A second terminal of the switch SW10 is coupled to receive the triangle wave signal TRI0. A second terminal of the switch SW13 is coupled to receive the reference voltage signal VR. A second terminal of the switch SW16 is coupled to receive the triangle wave signal TRI0. A second terminal of the switch SW19 is coupled to receive the reference voltage signal VR.

A non-inverting input of the amplifier 20 is coupled to a first terminal of a resistor R6 and to a first terminal of a resistor R7. A second terminal of the resistor R6 is coupled to a first terminal of switches SW11, SW14, SW17 and SW20. A second terminal of the switch SW11 is coupled to receive the positive peak voltage value VP+. A second terminal of the switch SW14 is coupled to receive the triangle wave signal TRI0. A second terminal of the switch SW17 is coupled to receive the negative peak voltage value VP-. A second terminal of the switch SW20 is coupled to receive the triangle wave signal TRI0. A second terminal of the resistor R7 is coupled to a first terminal of switches SW12, SW15, SW18 and SW21. A second terminal of the switch SW12 is coupled to receive the reference voltage VR. A second terminal of the switch SW15 is coupled to receive the positive peak voltage level VP+. A second terminal of the switch SW18 is coupled to receive the reference voltage VR. A second terminal of the switch SW21 is coupled to receive the negative peak voltage level VP-.

The output signal P is coupled as an input to the switch control circuit 22. The output signal Z is coupled as an input to the switch control circuit 22. A control signal CR1 is output from the switch control circuit 22 and coupled to control the operation of the switches SW10, SW11 and SW12 in a first region. A control signal CR2 is output from the switch control circuit 22 and coupled to control the operation of the switches SW13, SW14 and SW15 in a second region. A control signal CR3 is output from the switch control circuit 22 and coupled to control the operation of the switches SW16, SW17 and SW18 in a third region. A control signal CR4 is output from the switch control circuit 22 and coupled to control the operation of the switches SW19, SW20 and SW21 in a fourth region.

In the preferred embodiment of the present invention, each period of the triangle wave signal TRI0 is divided into four equal regions, as illustrated in FIG. 3, to generate the phase-shifted triangle wave signal TRI90. Within each of these four regions there is a unique combination of the values of the output signals P and Z. In the first region, the output signal P is at a low voltage level and the output signal Z is at a high voltage level. In the first region, the triangle wave signal TRI0 is decreasing from the positive peak level VP+ to the reference voltage level VR and the phase-shifted triangle wave signal TRI90 is increasing from the reference voltage level VR to the positive peak level VP+. Accordingly, in the first region, the slope of the phase-shifted triangle wave signal TRI90 is negative with respect to the slope of the triangle wave signal TRI0.

In the second region, the output signal P and the output signal Z are both at a low voltage level. Also in the second region, the triangle wave signal TRI0 is decreasing from the reference voltage level VR to the negative peak level VP- and the phase-shifted triangle wave signal TRI90 is decreasing from the positive peak level VP+ to the reference voltage level VR. Accordingly, in the second region, the slope of the phase-shifted triangle wave signal TRI90 is equal to the slope of the triangle wave signal TRI0.

In the third region, the output signal P is at a high voltage level and the output signal Z is at a low voltage level. Also in the third region, the triangle wave signal TRI0 is increasing from the negative peak level VP- to the reference voltage level VR and the phase-shifted triangle wave signal TRI90 is decreasing from the reference voltage level VR to the negative peak level VP−. Accordingly, in the third region, the slope of the phase-shifted triangle wave signal TRI90 is negative with respect to the slope of the triangle wave signal TRI0.

In the fourth region, the output signal P and the output signal Z are both at a high voltage level Also in the fourth region, the triangle wave signal TRI0 is increasing from the reference voltage level VR to the positive peak level VP+ and the phase-shifted triangle wave signal TRI90 is increasing from the negative peak level VP− to the reference voltage level VR. Accordingly, in the fourth region, the slope of the phase-shifted triangle wave signal TRI90 is equal to the slope of the triangle wave signal TRI0.

The phase-shifted triangle wave generator according to the present invention includes the amplifier 20 and the resistors R4–R7 coupled together in a unity-gain configuration. The switch control circuit 22 controls the network of switches including the switches SW10–SW21, according to the current region of the triangle wave signal TRI0, as specified by the voltage levels of the output signals P and Z. An appropriate voltage signal is coupled to each of the resistors R4, R5 and R7 to generate the phase-shifted triangle wave signal TRI90 in each region. The switch SW22 is a dummy switch which is always closed and coupled to the resistor R5 to match the impedance of the other switches, SW10–SW21, as seen from the other resistors R4, R6 and R7 coupled to the amplifier 20. At any point in time and in any one of the four regions of operation, each of the resistors R4–R7 has one and only one closed switch directly coupled to it and in series with it.

The switch control circuit 22 receives the output signals P and Z to determine the current region of the triangle wave signal TRI0. Depending on the level of the output signals P and Z, the switch control circuit determines the current region of the triangle wave signal TRI0 and pulls an appropriate one of the switch control signal lines CR1, CR2, CR3 and CR4 to a high voltage level. The remaining switch control signal lines are kept at a low voltage level. When a switch control signal line is at a low voltage level, the switches that are controlled by that switch control signal line are open. When a switch control signal line is pulled to a high voltage level, the switches that are controlled by that switch control signal line are closed. Preferably, only one of the switch control lines are pulled low in each region.

When the output signal P is at a low voltage level and the output signal Z is at a high voltage level, the triangle wave signal TRI0 is in the first region, and the switch control circuit 22 pulls the switch control signal line CR1 to a high voltage level, thereby closing the switches SW10, SW11 and SW12. When the switch SW10 is closed, the triangle wave signal TRI0 is coupled to the resistor R4. When the switch SW11 is closed, the positive peak voltage level VP+ is coupled to the resistor R6. When the switch SW12 is closed, the reference voltage VR is coupled to the resistor R7. In the first region, the amplifier 20 is therefore configured to have a gain equal to negative one and provide the phase-shifted triangle wave signal TRI90 in response to the levels of the triangle wave signal TRI0, the positive peak voltage level VP+ and the reference voltage VR. Accordingly, in the first region, as the triangle wave signal TRI0 is linearly decreasing from the positive peak voltage level VP+ to the reference voltage VR, the phase-shifted triangle wave signal TRI90 will linearly increase from the reference voltage VR to the positive peak level VP+.

When the output signal P and the output signal Z are both at low voltage levels, the triangle wave signal TRI0 is in the second region, and the switch control circuit 22 pulls the switch control signal line CR2 to a high voltage level, thereby closing the switches SW13, SW14 and SW15. When the switch SW13 is closed, the reference voltage VR is coupled to the resistor R4. When the switch SW14 is closed, the triangle wave signal TRI0 is coupled to the resistor R6. When the switch SW15 is closed, the positive peak voltage level VP+ is coupled to the resistor R7. In the second region, the amplifier 20 is therefore configured to have a gain equal to positive one and provide the phase-shifted triangle wave signal TRI90 in response to the levels of the reference voltage VR, the triangle wave signal TRI0 and the positive peak voltage level VP+. Accordingly, in the second region, as the triangle wave signal TRI0 is linearly decreasing from the reference voltage VR to the negative peak voltage level VP−, the phase-shifted triangle wave signal TRI90 will also linearly decrease from the positive peak voltage level VP+ to the reference voltage VR.

When the output signal P is at a high voltage level and the output signal Z is at a low voltage level, the triangle wave signal TRI0 is in the third region, and the switch control circuit 22 pulls the switch control signal line CR3 to a high voltage level, thereby closing the switches SW16, SW17 and SW18. When the switch SW16 is closed, the triangle wave signal TRI0 is coupled to the resistor R4. When the switch SW17 is closed, the negative peak voltage level VP− is coupled to the resistor R6. When the switch SW18 is closed, the reference voltage VR is coupled to the resistor R7. In the third region, the amplifier 20 is therefore configured to have a gain equal to negative one and provide the phase-shifted triangle wave signal TRI90 in response to the levels of the triangle wave signal TRI0, the negative peak voltage level VP− and the reference voltage VR. Accordingly, in the third region, as the triangle wave signal TRI0 is linearly increasing from the negative peak voltage level VP− to the reference voltage VR, the phase-shifted triangle wave signal TRI90 will linearly decrease from the reference voltage VR to the negative peak voltage level VP−.

When the output signal P and the output signal Z are both at a high voltage level, the triangle wave signal TRI0 is in the fourth region, and the switch control circuit 22 pulls the switch control signal line CR4 to a high voltage level, thereby closing the switches SW19, SW20 and SW21. When the switch SW19 is closed, the reference voltage VR is coupled to the resistor R4. When the switch SW20 is closed, the triangle wave signal TRI0 is coupled to the resistor R6. When the switch SW21 is closed, the negative peak voltage level VP− is coupled to the resistor R7. In the fourth region, the amplifier 20 is therefore configured to have a gain equal to positive one and provide the phase-shifted triangle wave signal TRI90 in response to the levels of the reference voltage VR, the triangle wave signal TRI0 and the negative peak voltage level VP−. Accordingly, in the fourth region, as the triangle wave signal TRI0 is linearly increasing from the reference voltage VR to the positive peak level VP+, the phase-shifted triangle wave signal TRI90 will also linearly increase from the negative peak level VP− to the reference voltage VR.

Figure 5:
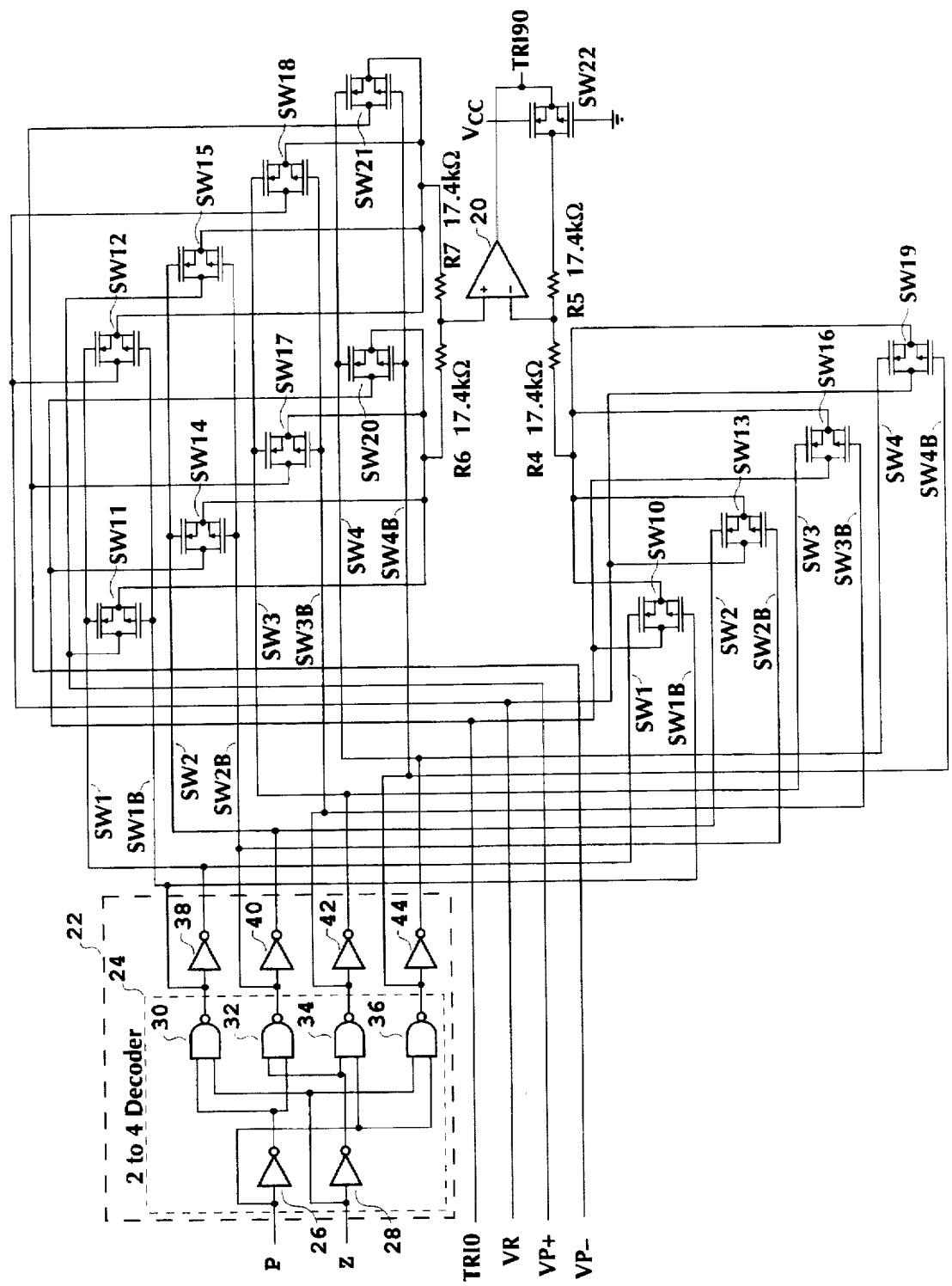
FIG. 5 illustrates a detailed schematic diagram of the phase-shifted triangle wave signal generator according to the present invention.

A detailed schematic of the preferred embodiment of the phase-shifted triangle wave generator of the present invention, including the switch control circuit 22, is illustrated in FIG. 5. The switch control circuit 22 preferably includes a 2–4 decoder circuit 24. Within the decoder circuit 24, the output signal P is coupled to an input of an inverter 26 and as an input to logical NAND gates 34 and 36. The output signal Z is coupled to an input of an inverter 28 and as an input to logical NAND gates 30 and 36. An output of the inverter 26 is coupled as an input to logical NAND gates 30 and 32. An output of the inverter 28 is coupled as an input to logical NAND gates 32 and 34.

An output of the logical NAND gate 30 is coupled to an input of an inverter 38 and as an inverted switch control signal SW1B. An output of the inverter 38 provides the switch control signal SW1. The switch control signal SW1 corresponds to the switch control signal CR1, as illustrated in FIG. 4. The inverted switch control signal SW1B is the inverse of the switch control signal SW1.

An output of the logical NAND gate 32 is coupled to an input of an inverter 40 and as an inverted switch control signal SW2B. An output of the inverter 40 provides the switch control signal SW2. The switch control signal SW2 corresponds to the switch control signal CR2, as illustrated in FIG. 4. The inverted switch control signal SW2B is the inverse of the switch control signal SW2.

An output of the logical NAND gate 34 is coupled to an input of an inverter 42 and as an inverted switch control signal SW3B. An output of the inverter 42 provides the switch control signal SW3. The switch control signal SW3 corresponds to the switch control signal CR3, as illustrated in FIG. 4. The inverted switch control signal SW3B is the inverse of the switch control signal SW3.

An output of the logical NAND gate 36 is coupled to an input of an inverter 44 and as an inverted switch control signal SW4B. An output of the inverter 44 provides the switch control signal SW4. The switch control signal SW4 corresponds to the switch control signal CR4, as illustrated in FIG. 4. The inverted switch control signal SW4B is the inverse of the switch control signal SW4.

The switch control signals SW1, SW2, SW3 and SW4 and the corresponding inverted switch control signals SW1B, SW2B, SW3B and SW4B are coupled to the appropriate switches SW10–SW21. Each of the switches SW10–SW21 includes an NMOS transistor and a PMOS transistor coupled together in parallel. The switch control signal SW1 and the inverted switch control signal SW1B are coupled to the switches SW10, SW11 and SW12 to control operation of the amplifier 20 in the first region. The switch control signal SW2 and the inverted switch control signal SW2B are coupled to the switches SW13, SW14 and SW15 to control operation of the amplifier in the second region. The switch control signal SW3 and the inverted switch control signal SW3B are coupled to the switches SW16, SW17 and SW18 to control operation of the amplifier in the third region. The switch control signal SW4 and the inverted switch control signal SW4B are coupled to the switches SW19, SW20 and SW21 to control operation of the amplifier in the fourth region. The remaining components of the phase-shifted triangle wave signal generator are coupled as illustrated and described in reference to FIG. 4.

Figure 6:
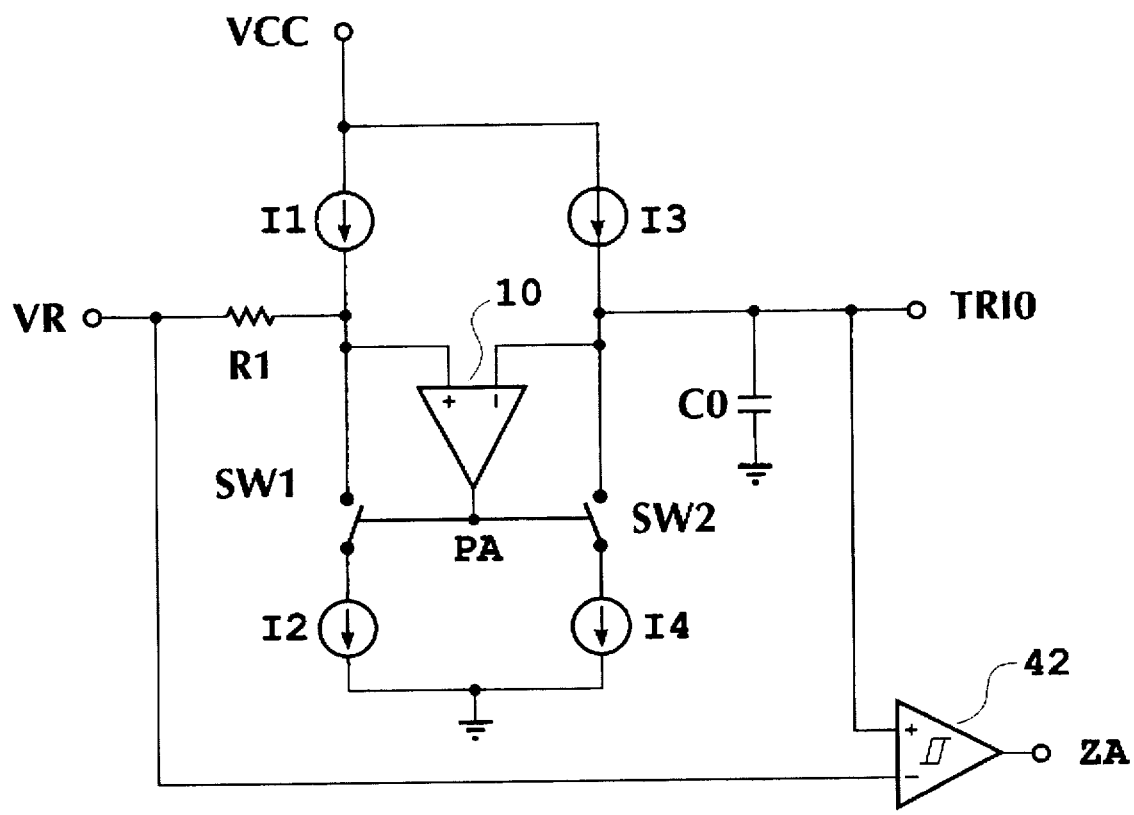
FIG. 6 illustrates a schematic diagram of a triangle wave signal generator of an alternate embodiment.
Figure 8:
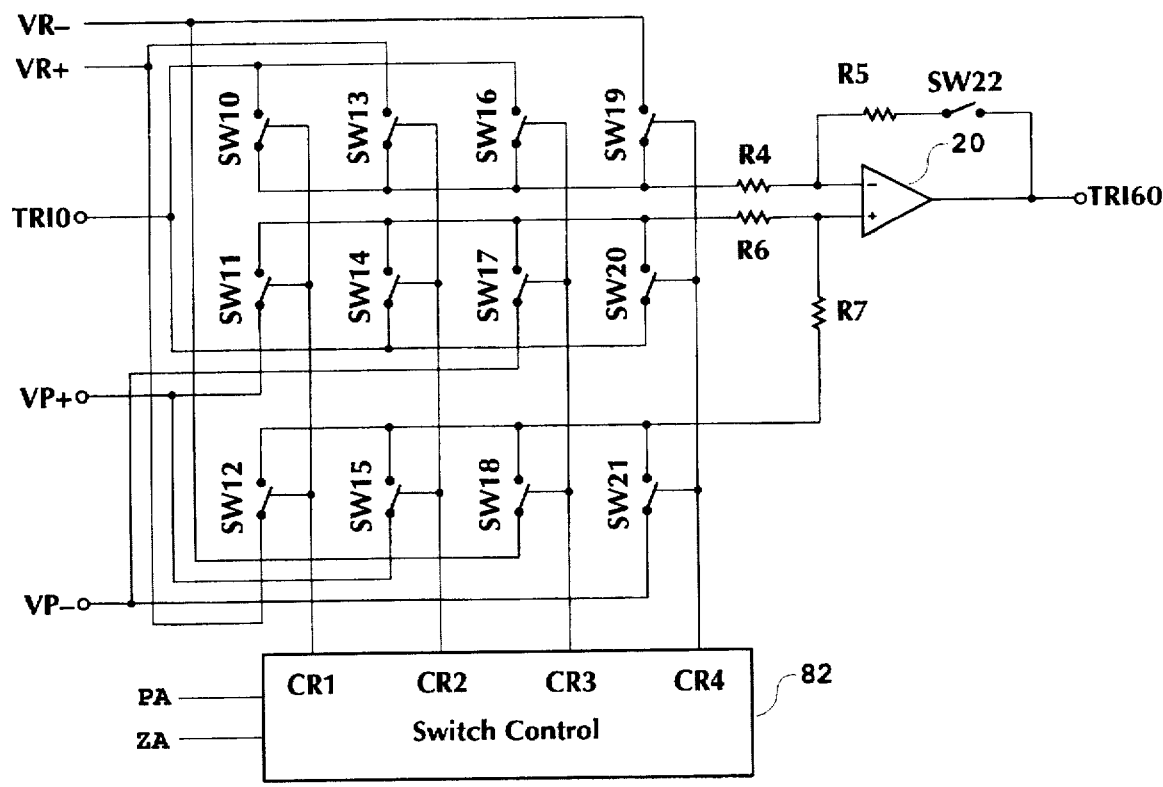
FIG. 8 illustrates a schematic diagram of a phase-shifted triangle wave signal generator of an alternate embodiment of the present invention.
Figure 9:
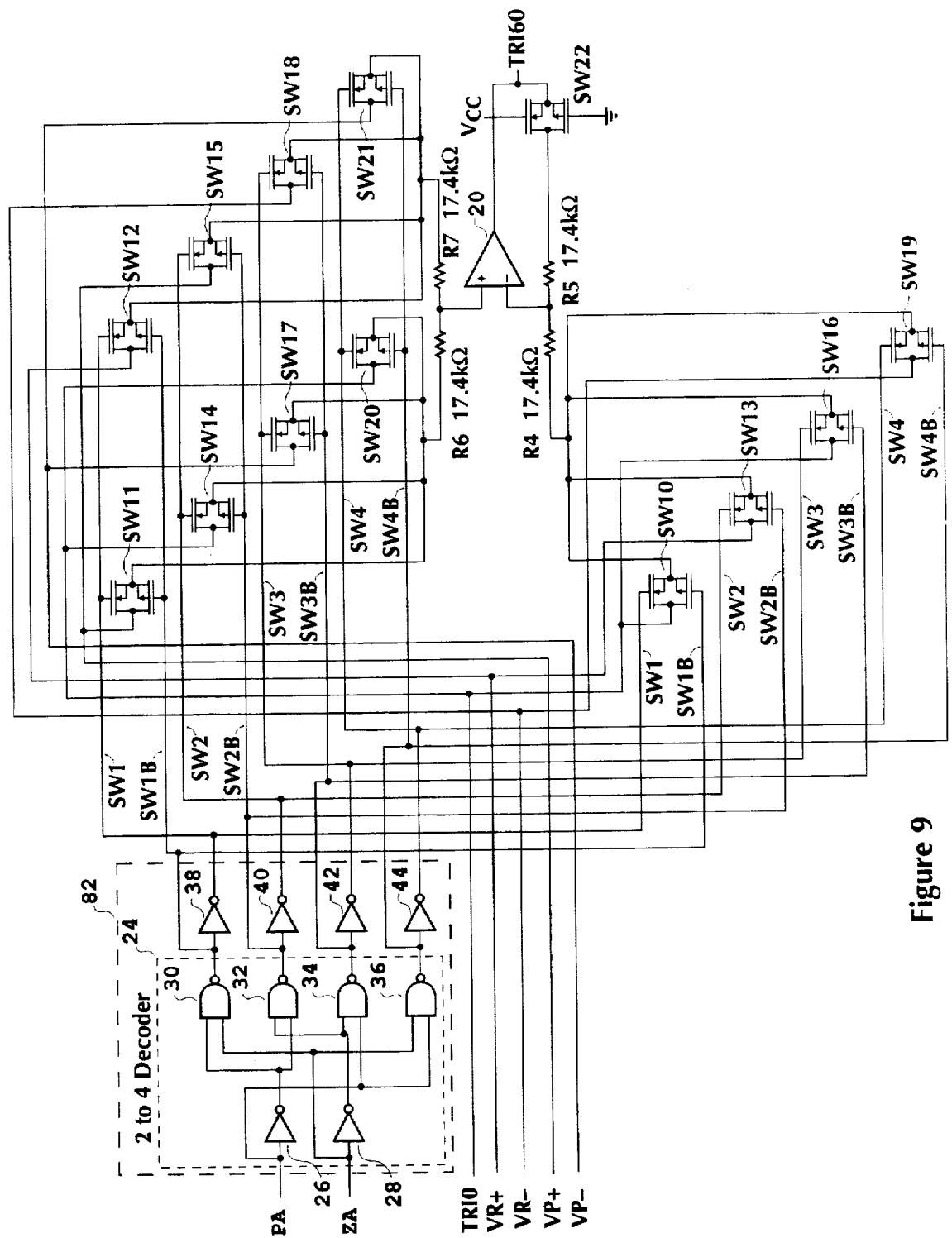
FIG. 9 illustrates a detailed schematic diagram of the phase-shifted triangle wave signal generator of an alternate embodiment of the present invention.

While the preferred embodiment of the phase-shifted triangle wave generator according to the present invention provides a ninety degree phase shift with respect to the reference signal, other degrees of phase shifts can also be provided using the phase-shifted triangle wave signal generator of the present invention. An alternate embodiment of the present invention for providing phase shifts with respect to a reference signal is illustrated in FIGS. 6, 8 and 9. In this alternate embodiment, the comparator 12 which provided the output signal Z, is replaced with a hysteretic comparator 42 for generating an output signal ZA. This hysteretic comparator 42 has positive and negative threshold levels at which the output signal ZA changes states. The positive and negative threshold levels are set at a specific hysteresis amount above and below the reference voltage VR. With precisely set positive and negative threshold levels for the comparator 42, centered around the reference voltage VR, the phase-shift signal generator of the present invention will provide an output signal having any desired phase shift with respect to a reference signal.

A schematic diagram of a phase-shifted triangle wave generator of this alternate embodiment of the present invention is illustrated in FIG. 8. The phase-shifted triangle wave generator uses the triangle wave signal TRI0 and other signals generated by the triangle wave generator of FIG. 6 to generate the phase-shifted triangle wave signal. As an example of the operation of this embodiment, a sixty degree phase shift is implemented by the phase-shifted triangle wave generator of FIG. 8 in order to generate the phase-shifted triangle wave signal TRI60.

In the phase-shifted triangle wave generator of FIG. 8, an inverting input of an amplifier 20 is coupled to a first terminal of a resistor R4 and to a first terminal of a resistor R5. A second terminal of the resistor R5 is coupled to a first terminal of a switch SW22. A second terminal of the switch SW22 is coupled to an output of the amplifier 20, thereby forming a node from which the sixty degree phase-shifted triangle wave signal TRI60 is provided. A second terminal of the resistor R4 is coupled to a first terminal of switches SW10, SW13, SW16 and SW19. A second terminal of the switch SW10 is coupled to receive the triangle wave signal TRI0. A second terminal of the switch SW13 is coupled to receive the positive hysteresis threshold value VR+. A second terminal of the switch SW16 is coupled to receive the triangle wave signal TRI0. A second terminal of the. switch SW19 is coupled to receive the negative hysteresis threshold value VR–.

A non-inverting input of the amplifier 20 is coupled to a first terminal of a resistor R6 and to a first terminal of a resistor R7. A second terminal of the resistor R6 is coupled to a first terminal of switches SW11, SW14, SW17 and SW20. A second terminal of the switch SW11 is coupled to receive the positive peak voltage value VP+. A second terminal of the switch SW14 is coupled to receive the triangle wave signal TRI0. A second terminal of the switch SW17 is coupled to receive the negative peak voltage value VP–. A second terminal of the switch SW20 is coupled to receive the triangle wave signal TRI0. A second terminal of the resistor R7 is coupled to a first terminal of switches SW12, SW15, SW18 and SW21. A second terminal of the switch SW12 is coupled to receive the positive hysteresis threshold value VR+. A second terminal of the switch SW15 is coupled to receive the positive peak voltage level VP+. A second terminal of the switch SW18 is coupled to receive the negative hysteresis threshold value VR–. A second terminal of the switch SW21 is coupled to receive the negative peak voltage level VP–.

The output signal PA is coupled as an input to the switch control circuit 82. The output signal ZA is also coupled as an input to the switch control circuit 82. A control signal CR1 is output from the switch control circuit 82 and coupled to control the operation of the switches SW10, SW11 and SW12 in the first region. A control signal CR2 is output from the switch control circuit 82 and coupled to control the operation of the switches SW13, SW14 and SW15 in the second region. A control signal CR3 is output from the switch control circuit 82 and coupled to control the operation of the switches SW16, SW17 and SW18 in the third region. A control signal CR4 is output from the switch control circuit 82 and coupled to control the operation of the switches SW19, SW20 and SW21 in the fourth region.

The phase-shifted triangle wave generator illustrated in FIG. 8 includes the amplifier 20 and the resistors R4–R7 coupled together in a unity-gain configuration. The switch control circuit 82 controls the network of switches including the switches SW10–SW21, according to the current region of the triangle wave signal TRI0, as specified by the voltage levels of the output signals PA and ZA. An appropriate voltage signal is coupled to each of the resistors R4, R5 and R7 to generate the phase-shifted triangle wave signal TRI60 in each region. As described above, the switch SW22 is a dummy switch which is always closed and coupled to the resistor R5 to match the impedance of the other switches, SW10–SW21, as seen from the other resistors R4, R6 and R7 coupled to the amplifier 20. At any point in time and in any one of the four regions of operation, each of the resistors R4–R7 has one and only one closed switch directly coupled to it and in series with it.

A detailed schematic of the phase-shifted triangle wave generator with hysteresis, including the switch control circuit 82, is illustrated in FIG. 9. The switch control circuit 82 preferably includes a 2–4 decoder circuit 24. Within the decoder circuit 24, the output signal PA is coupled to an input of an inverter 26 and as an input to logical NAND gates 34 and 36. The output signal ZA is coupled to an input of an inverter 28 and as an input to logical NAND gates 30 and 36. An output of the inverter 26 is coupled as an input to logical NAND gates 30 and 32. An output of the inverter 28 is coupled as an input to logical NAND gates 32 and 34.

An output of the logical NAND gate 30 is coupled to an input of an inverter 38 and as an inverted switch control signal SW1B. An output of the inverter 38 provides the switch control signal SW1. The switch control signal SW1 corresponds to the switch control signal CR1, as illustrated in FIG. 8. The inverted switch control signal SW1B is the inverse of the switch control signal SW1.

An output of the logical NAND gate 32 is coupled to an input of an inverter 40 and as an inverted switch control signal SW2B. An output of the inverter 40 provides the switch control signal SW2. The switch control signal SW2 corresponds to the switch control signal CR2, as illustrated in FIG. 8. The inverted switch control signal SW2B is the inverse of the switch control signal SW2.

An output of the logical NAND gate 34 is coupled to an input of an inverter 42 and as an inverted switch control signal SW3B. An output of the inverter 42 provides the switch control signal SW3. The switch control signal SW3 corresponds to the switch control signal CR3, as illustrated in FIG. 8. The inverted switch control signal SW3B is the inverse of the switch control signal SW3.

An output of the logical NAND gate 36 is coupled to an input of an inverter 44 and as an inverted switch control signal SW4B. An output of the inverter 44 provides the switch control signal SW4. The switch control signal SW4 corresponds to the switch control signal CR4, as illustrated in FIG. 8. The inverted switch control signal SW4B is the inverse of the switch control signal SW4.

The switch control signals SW1, SW2, SW3 and SW4 and the corresponding inverted switch control signals SW1B, SW2B, SW3B and SW4B are coupled to the appropriate switches SW10–SW21. Each of the switches SW10–SW21 includes an NMOS transistor and a PMOS transistor coupled together in parallel. The switch control signal SW1 and the inverted switch control signal SW1B are coupled to the switches SW10, SW11 and SW12 to control operation of the amplifier 20 in the first region. The switch control signal SW2 and the inverted switch control signal SW2B are coupled to the switches SW13, SW14 and SW15 to control operation of the amplifier in the second region. The switch control signal SW3 and the inverted switch control signal SW3B are coupled to the switches SW16, SW17 and SW18 to control operation of the amplifier in the third region. The switch control signal SW4 and the inverted switch control signal SW4B are coupled to the switches SW19, SW20 and SW21 to control operation of the amplifier in the fourth region. The remaining components of the phase-shifted triangle wave signal generator are coupled as illustrated and described in reference to FIG. 8.

FIGS. 7A–7D illustrate waveforms corresponding to signals within the alternate embodiment, illustrated in FIGS. 6, 8 and 9 implementing a sixty degree phase shift. The triangle wave reference signal TRI0 is illustrated in FIG. 7A. The triangle wave signal TRI0 is generated by the triangle wave signal generator of FIG. 6, as explained above, in reference to the triangle wave signal generator of FIG. 1. The output signal PA, provided from the output of the comparator 10, is illustrated in FIG. 7C. The output signal PA, illustrated in FIG. 7C, is identical to the output signal P, illustrated in FIG. 3C. The output signal PA is a squarewave, having a period equal to the period of the triangle wave signal TRI0, which changes voltage levels at the high and low peaks of the triangle wave signal TRI0. The output signal PA is at a low value when the triangle wave signal TRI0 is decreasing and at a high value when the triangle wave signal TRI0 is increasing. The output signal ZA, provided from the output of the comparator 42, is illustrated in FIG. 7D. The output signal ZA is a squarewave, also having a period equal to the period of the triangle wave signal TRI0, which changes voltage levels at the hysteresis thresholds VR+ and VR− of the hysteretic comparator 42. The output signal ZA changes from a high voltage level to a low voltage level when the value of the triangle wave signal TRI0 falls below the positive hysteresis threshold level VR+. The output signal ZA changes from a low voltage level to a high voltage level when the value of the triangle wave signal TRI0 rises above the negative hysteresis threshold level VR−.

The hysteresis threshold levels VR+ and VR− are symmetrically centered about the reference voltage VR and can be programmed to provide any desired phase shift. Generally, the hysteresis threshold levels VR+ and VR− are calculated using the following equations:

$$VR+ = VR + [(90-X)/90][VP-VR] \quad 0 \leq X \leq 90 \quad (3)$$

$$VR- = VR - [(90-X)/90][VP-VR] \quad 0 \leq X \leq 90 \quad (4)$$

In the equations 3 and 4, X represents the degree of phase shift desired in the phase-shifted triangle wave signal output from the phase-shifted signal generator. The degree of phase shift X for this alternate embodiment is equal to or between zero degrees and ninety degrees. The waveforms illustrated in FIG. 7, represent a phase shift of sixty degrees between the phase-shifted triangle wave signal TRI60 and the triangle wave reference signal TRI0. For a phase-shift of sixty degrees, the equations 3 and 4 can be rewritten as follows:

$$VR+ = VR + [\tfrac{1}{3}][VP-VR]$$

$$VR- = VR - [\tfrac{1}{3}][VP-VR]$$

For this example, the positive hysteresis threshold level VR+ is equal to the reference voltage VR plus one-third of the difference between the positive peak voltage level VP+ and the reference voltage VR. The negative hysteresis threshold level VR− is equal to the reference voltage VR minus one-third of the difference between the positive peak voltage level VP+ and the reference voltage VR.

A phase-shifted triangle wave signal TRI60 is illustrated in FIG. 7B. The phase-shifted triangle wave signal TRI60 is sixty degrees out of phase from the triangle wave signal TRI0. The triangle wave signal TRI0 is used as a reference and the output signals PA and ZA are used by the phase-shifted triangle wave signal generator, illustrated in FIGS. 8 and 9, to generate the phase-shifted triangle wave signal TRI60. The phase-shifted triangle wave signal generator with hysteresis, used to generate the sixty-degree phase-shifted triangle wave signal TRI60, is identical to the circuit illustrated in FIGS. 4 and 5, except that the output signals PA and ZA are provided as inputs to the switch control circuit 82, the phase-shifted triangle wave signal TRI60 is provided as an output from the amplifier 20, the positive hysteresis threshold value VR+ is coupled to the switches SW12 and SW13 and the negative threshold value VR− is coupled to the switches SW18 and SW19.

When a phase shift other than ninety degrees is implemented, using the positive and negative hysteresis levels VR+ and VR−, the four regions are not of equal time duration, as illustrated in FIG. 7. The first region occurs between when the triangle wave signal TRI0 is at the positive peak voltage level VP+ and when the triangle wave signal TRI0 falls to the positive threshold level VR+. The second region occurs between when the triangle wave signal TRI0 is at the positive threshold level VR+ and when the triangle wave signal TRI0 falls to the negative peak voltage level VP−. The third region occurs between when the triangle wave signal TRI0 is at the negative peak voltage level VP− and when the triangle wave signal TRI0 rises to the negative threshold level VR−. The fourth region occurs between when the triangle wave signal TRI0 is at the negative threshold level VR− and when the triangle wave signal TRI0 rises to the positive peak voltage level VP+.

The phase-shifted triangle wave signal generator with hysteresis, illustrated in FIGS. 6, 8 and 9, operates as described above. The phase-shined triangle wave signal generator with hysteresis includes the switch control circuit 82 which uses the output signals PA and ZA to determine the region and to appropriately control the switches SW10–SW21. When the output signal PA is at a low voltage level and the output signal ZA is at a high voltage level, the switch control circuit 82 recognizes that the triangle wave signal TRI0 is in the first region and the switch control signal CR1 is pulled to a high voltage level, thereby closing the switches SW10–SW12. When the output signals PA and ZA are both at a low voltage level, the switch control circuit recognizes that the triangle wave signal TRI0 is in the second region and the switch control signal CR2 is pulled to a high voltage level, thereby closing the switches SW13–SW15. When the output signal PA is at a high voltage level and the output signal ZA is at a low voltage level, the switch control circuit recognizes that the triangle wave signal TRI0 is in the third region and the switch control signal CR3 is pulled to a high voltage level, thereby closing the switches SW16–SW18. When the output signals PA and ZA are both at high voltage levels, the switch control circuit recognizes that the triangle wave signal TRI0 is in the fourth region and the switch control signal CR4 is pulled to a high voltage level, thereby closing the switches SW19–SW21.

A phase-shifted signal generator, according to the present invention, generates a signal which is shifted in phase with respect to a reference signal. The phase-shifted signal generator uses a network of switches to couple appropriate signals to an amplifier, based on a current region of the reference signal. The amplifier generates the phase-shifted signal in response to the signals coupled to it by the network of switches. The phase-shifted signal generator includes only one external capacitor which is used to generate the reference signal. No external capacitors are necessary to generate the phase-shifted signal. Furthermore, the phase-shifted signal generator of the present invention does not require a DC level restore circuit to restore the level of the phase-shifted signal.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A phase-shifted signal generator for generating a phase-shifted signal, shifted in phase with respect to a reference signal, the signal generator comprising:
   a. means for receiving a peak output signal, representing whether the reference signal is increasing or decreasing, and a threshold output signal, representing whether the reference signal is above a first threshold level or below a second threshold level;
   b. means for selecting ones from of a plurality of reference signals taken from the reference signal at points in time, the means for selecting coupled to receive an output from the means for receiving; and
   c. means for combining the selected ones of the plurality of reference signals for forming the phase-shifted signal.

2. The phase-shifted signal generator according to claim 1 wherein the phase-shifted signal generator is integrated and wherein the phase-shifted signal generator does not require a capacitor external to the integrated generator for forming the phase-shifted signal.

3. The phase-shifted signal generator according to claim 1 wherein the means for combining is an amplifier circuit having inputs coupled to receive the selected ones of the plurality of reference signals and an output for forming the phase-shifted signal.

4. The phase-shifted signal generator according to claim 1 wherein the first threshold level is equal to the second threshold level.

5. The phase-shifted signal generator according to claim 1 wherein the first and second threshold levels are each equal to a reference voltage level representative of a center level of the reference signal.

6. The phase-shifted signal generator according to claim 1 wherein the first threshold level is not equal to the second threshold level.

7. The phase-shifted signal generator according to claim 1 wherein the reference signal has a predetermined period and amplitude.

8. The phase-shifted signal generator according to claim 7 wherein the reference signal is a triangle wave signal.

9. The phase-shifted signal generator according to claim 8 wherein the first threshold level is equal to the second threshold level.

10. The phase-shifted signal generator according to claim 8 wherein the first and second threshold levels are each equal to a reference voltage level representative of a center level of the reference signal.

11. The phase-shifted signal generator according to claim 8 wherein the first threshold level is not equal to the second threshold level.

12. A method of generating a phase-shifted signal, shifted in phase with respect to a reference signal, the method comprising steps of:
   a. receiving a peak output signal, representing whether the reference signal is increasing or decreasing;
   b. receiving a threshold output signal, representing whether the reference signal is above a first threshold level or below a second threshold level;
   c. selecting ones from of a plurality of reference signals taken from the reference signal at points in time, the selection made according to the peak output signal and the threshold output signal; and
   d. combining the selected ones of the plurality of reference signals for forming the phase-shifted signal.

13. The method according to claim 12 wherein performance of the steps a.–d. does not require using a discrete capacitor.

14. The method according to claim 12 wherein the step of combining utilizes an amplifier circuit having inputs coupled to receive the selected ones of the plurality of reference signals and an output for forming the phase-shifted signal.

15. The method according to claim 12 wherein the first threshold level is equal to the second threshold level.

16. The method according to claim 12 wherein the first and second threshold levels are each equal to a reference voltage level representative of a center level of the reference signal.

17. The method according to claim 12 wherein the first threshold level is not equal to the second threshold level.

18. The method according to claim 12 wherein the reference signal has a predetermined period and amplitude.

19. The method according to claim 18 wherein the reference signal is a triangle wave signal.

20. The method according to claim 19 wherein the first threshold level is equal to the second threshold level.

21. The method according to claim 19 wherein the first and second threshold levels are each equal to a reference voltage level representative of a center level of the reference signal.

22. The method according to claim 19 wherein the first threshold level is not equal to the second threshold level.

23. A method of generating a phase-shifted signal shifted in phase with respect to a reference signal comprising the steps of:
   a. receiving the reference signal having a period and amplitude;
   b. determining a current region of the reference signal based on a peak output signal, representing whether the reference signal is increasing or decreasing, and based on a threshold output signal, representing whether the reference signal is above a first threshold level or below a second threshold level; and
   c. coupling a plurality of reference voltages to an amplifier circuit, based on the current region of the reference signal, wherein the reference voltages represent values from the reference signal at different points in time and wherein the amplifier circuit forms the phase-shifted signal.

24. The method as claimed in claim 23 wherein the first threshold level and the second threshold level are each equal to a reference voltage level representative of a center level of the reference signal.

25. The method as claimed in claim 23 wherein the first threshold level and the second threshold level are not equal and wherein the threshold output signal is generated by a hysteretic comparator coupled to compare the first threshold level and the second threshold level to the reference signal.

26. The method as claimed in claim 25 wherein a degree of phase-shift between the phase-shifted signal and the reference signal is determined by the first and second threshold levels.

27. The method as claimed in claim 26 wherein the first and second threshold levels are programmable for programmably changing the degree of phase shift.

28. A phase-shifted signal generator for generating a phase-shifted signal shifted in phase with respect to a reference signal comprising:
   a. a switch control circuit configured for receiving a peak output signal, representing whether the reference signal is increasing or decreasing, and a threshold output signal, representing whether the reference signal is above a first threshold level or below a second threshold level, wherein the switch control circuit determines a current region of the reference signal based on the peak output signal and the threshold output signal;
   b. a switching network including a plurality of switches, each switch controlled by the switch control circuit and coupled to an appropriate one of a plurality of reference voltages taken from the reference signal at specific points in time, wherein a number of switches of the plurality are closed by the switch control circuit based on the current region of the reference signal; and
   c. an amplifier circuit coupled to the plurality of switches to receive selected ones of the reference voltages through the number of switches closed by the switch control circuit, for generating the phase-shifted signal in response to the selected ones of the reference voltages.

29. The phase-shifted signal generator as claimed in claim 28 wherein the plurality of reference voltages includes the reference signal, a reference voltage level representative of a center level of the reference signal, a positive peak voltage level and a negative peak voltage level.

30. The phase-shifted signal generator as claimed in claim 29 wherein the first threshold level and the second threshold level are each equal to the reference voltage level.

31. The phase-shifted signal generator as claimed in claim 30 wherein the current region of the reference signal is a then-existing one of exactly four distinct regions of the reference signal.

32. The phase-shifted signal generator as claimed in claim 31 wherein the phase-shifted signal has a period equal to a period of the reference signal.

33. The phase-shifted signal generator as claimed in claim 28 wherein the first threshold level and the second threshold level are not equal and wherein the threshold output signal is generated by a hysteretic comparator coupled to compare the first threshold level and the second threshold level to the reference signal.

34. The phase-shifted signal generator as claimed in claim 33 wherein a degree of phase-shift between the phase-shifted signal and the reference signal is determined by the first and second threshold levels.

35. The phase-shifted signal generator as claimed in claim 34 wherein the first and second threshold levels are programmable for programmably changing the degree of phase shift.

36. A signal generator comprising:
   a. a first signal generating circuit for generating a reference signal having a predetermined period, a reference voltage level representative of a center level of the reference signal, a positive peak voltage level and a negative peak voltage level, wherein the reference signal is divided into a first region, a second region, a third region and a fourth region; and b. a second signal generating circuit coupled to the first signal generating circuit, the second signal generating circuit for generating a phase-shifted signal shifted in phase from the reference signal and having the predetermined period, the reference voltage level, the positive peak voltage level and the negative peak voltage level including:
  i. a switch control circuit coupled to receive one or more signals representing which region the reference signal is in;
  ii. a switching network including a plurality of switches, each switch controlled by the switch control circuit and coupled to receive an appropriate one of the reference signal, the reference voltage level, the positive peak voltage level and the negative peak voltage level; and
  iii. an amplifier circuit coupled to the plurality of switches to receive selected ones of the reference signal, the reference voltage level, the positive peak voltage level and the negative peak voltage level, as controlled by the switch control circuit, based on which region the reference signal is in, for generating the phase-shifted signal.

37. The signal generator as claimed in claim 36 wherein the one or more signals representing which region the reference signal is in include a peak output signal, representing whether the reference signal is increasing or decreasing, and a threshold output signal, representing whether the reference signal is above a first threshold level or below a second threshold level wherein the first and second threshold levels are not equal to each other.

38. The signal generator as claimed in claim 36 wherein the one or more signals representing which region the reference signal is in include a peak output signal, representing whether the reference signal is increasing or decreasing, and a threshold output signal, representing whether the reference signal is above or below a threshold level.

39. The signal generator as claimed in claim 38 wherein the threshold level is the reference voltage level.

40. A phase-shifted signal generator for generating a phase-shifted triangle wave signal shifted in phase with respect to a reference triangle wave signal comprising:

a. means for receiving the reference triangle wave signal having a frequency; and b. means for generating the phase-shifted triangle wave signal shifted in phase with respect to the reference triangle wave signal by a predetermined amount of phase shift, wherein the means for generating includes a determining circuit for receiving one or more signals representative of the reference triangle wave signal, the one or more signals including a peak output signal, representing whether the reference triangle wave signal is increasing or decreasing, and a threshold output signal, representing whether the reference triangle wave signal is above a first threshold level or below a second threshold level, wherein the determining circuit determines the current region of the reference triangle wave signal based on the one or more signals and wherein the means for generating generates the phase-shifted signal using the reference triangle wave signal and wherein the predetermined amount of phase shift is independent of the frequency of the reference triangle wave signal.

41. The phase-shifted signal generator as claimed in claim 40 wherein the first threshold level and the second threshold level are each equal to a reference voltage level representative of a center level of the reference triangle wave signal.

42. The phase-shifted signal generator as claimed in claim 40 wherein the first threshold level and the second threshold level are not equal and wherein the threshold output signal is generated by a hysteric comparator coupled to compare the first threshold level and the second threshold level to the reference triangle wave signal.

* * * * *

UNITED STATES PATENT AND TRADEMARK OFFICE
CERTIFICATE OF CORRECTION

PATENT NO.  : 5,714,897

DATED       : February 3, 1998

INVENTOR(S) : Mark Vitunic et al.

It is certified that error appears in the above-identified patent and that said Letters Patent is hereby correct as shown below:

In column 1, line 21, delete "current source 12" and insert --current source I2--.

In column 4, line 1, delete "current dram by" and insert --current drawn by--.

In column 7, line 6, delete "voltage level Also" and insert --voltage level. Also--.

In column 10, line 31, delete "of the. switch" and insert --of the switch--.

In column 13, line 40, delete "phase-shined" and insert --phase-shifted--.

Signed and Sealed this

Twenty-first Day of April, 1998

Attest:

BRUCE LEHMAN

Attesting Officer        Commissioner of Patents and Trademarks